(12) United States Patent
Nakamura (10) Patent No.: US 6,573,178 B1
(45) Date of Patent: Jun. 3, 2003

(54) MANUFACTURING METHOD FOR SEMICONDUCTOR DEVICE AND SEMICONDUCTOR MANUFACTURING APPARATUS

(75) Inventor: Iwao Nakamura, Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/556,160

(22) Filed: Apr. 21, 2000

(30) Foreign Application Priority Data

Apr. 21, 1999 (JP) .......................................... 11-113019

(51) Int. Cl.[7] .......................................... H01L 21/4763
(52) U.S. Cl. ...................... 438/643; 438/680; 438/682; 438/683; 438/773; 438/775
(58) Field of Search .................... 438/643, 682, 438/683, 905, 680, 685, 38, 655, 773, 296, 585, 720, 396, 775, 791, 974, 653, 660

(56) References Cited

U.S. PATENT DOCUMENTS 5,637,153 A * 6/1997 Niino et al. ............. 134/22.11
5,963,834 A * 10/1999 Hatano et al. ............. 438/680

FOREIGN PATENT DOCUMENTS

JP  04-111417  4/1992
JP  05-190470  7/1993

* cited by examiner

Primary Examiner—Matthew Smith
Assistant Examiner—Igwe W. Anya
(74) Attorney, Agent, or Firm—Hogan & Hartson, LLP (57) ABSTRACT

A method for manufacturing a semiconductor device, includes forming a film on a substrate to be processed in a reaction furnace at a first temperature, unloading the substrate from the reaction furnace, and lowering a temperature in the reaction furnace to a second temperature which is lower than the first temperature, conducting a gas purge, using only an inert gas, in the reaction furnace after the substrate has been unloaded from the reaction furnace.

16 Claims, 3 Drawing Sheets

MANUFACTURING METHOD FOR SEMICONDUCTOR DEVICE AND SEMICONDUCTOR MANUFACTURING APPARATUS

BACKGROUND OF THE INVENTION

1. Field of the Invention

The present invention relates to a manufacturing method for a semiconductor device and a semiconductor manufacturing apparatus, and more particularly, to a semiconductor device manufacturing method utilizing a CVD (Chemical Vapor Deposition) film formation process and a semiconductor manufacturing apparatus utilizing a CVD film formation process.

2. Description of the Related Art

In a processing for manufacturing a semiconductor device, a film is formed on a substrate to be processed such as a semiconductor silicon wafer by a chemical vapor deposition (CVD) method.

A wafer processing will be explained below with reference to FIGS. 3 and 4.

In a state where a load lock chamber 1 and a reaction furnace 2 are under the atmospheric pressure, a boat 10 is lowered (unloaded) from the reaction furnace 2 to the load lock chamber 1. In the state where the boat 10 is lowered, a predetermined number of wafers 11 are mounted on the boat 10 by a substrate transfer apparatus (not shown) (step 41).

A temperature in the reaction furnace 2 is maintained at a film forming temperature during operation. The boat 10 is hoisted by a boat elevator (not shown), and the wafers 11 are brought (loaded) into the reaction furnace 2 (step 42).

An interior of the reaction furnace 2 is evacuated into vacuum by an evacuating device 9 (step 43), reaction gas is introduced into the reaction furnace 2 through gas introducing lines 7 and 8, and films are formed on the wafers 11 (step 44).

After the film forming processing is completed, the pressure in the reaction furnace 2 is brought back to the atmospheric pressure (step 45), and the boat 10 is unloaded and pulled into the load lock chamber 1 by the boat elevator (not shown) (step 46). In the load lock chamber 1, the boat 10 is cooled (step 47), the wafers 11 are removed by the substrate transfer apparatus (not shown) (step 48).

When the wafer removal is completed, unprocessed wafers are further mounted on the boat 10 and then, the load lock chamber 1 is once evacuated into vacuum by a vacuum evacuating device 13 to eliminate moisture and oxygen in the air. Thereafter, nitrogen gas is introduced from a gas purge nozzle 12, the pressure in the load lock chamber 1 is brought back to the atmospheric pressure which is substantially the same as the pressure in the reaction furnace 2. Next, the boat 10 is loaded into the reaction furnace 2, and the processing is continued.

If a film, e.g. an SiN film is formed on a substrate to be processed such as a wafer and a glass substrate by a CVD apparatus, by-products of reaction are adhered and deposited on a wall surface of the reaction furnace, thereby forming the film. This deposited film grows whenever the substrate processing is repeated, and when a thickness of the film reaches a predetermined value, cracking and peeling are caused to generate particles. The particles float in the reaction furnace and adhere to the substrate to be processed. When the number of particles is increased and the number of particles adhering to the substrate to be processed is increased, detrimental effects that yield is lowered and quality of product is deteriorated are generated. Especially in the case of a $Si_3N_4$ film whose film thickness generated by one time processing is equal to or greater than 1000 Å, this phenomenon becomes remarkable. It is conceivable that the $Si_3N_4$ film is subjected to a self cleaning which is usually carried out in the case of polycrystalline film. However, in the case of the $Si_3N_4$ film, since particles are generated when the deposited film thickness reaches 1 $\mu$m, it is necessary to carry out the cleaning whenever film thickness of the deposited $Si_3N_4$ film reaches 1 $\mu$m. Therefore, a frequency of the cleaning is higher than that of the polycrystalline film, and this causes inconvenience that quartz member is degraded due to the cleaning gas.

It is considered that the cracking of the reaction by-product deposited film is generated if residue stress at the time of deposited film formation is increased together with growth of the film, and thermal stress is generated due to difference in thermal expansion between the deposited film and an outer tube 5 and between the deposited film and an inner tube 6, and these stresses exceed tolerance limits (mechanical disruptive strength of the deposited film). The cracking of the deposited film progresses into film peeling in due time, but particles are generated even when the deposited film cracking is generated. The particle at that time is extremely fine as small as about 0.1 to 0.2 $\mu$m.

Further, it is considered that the cracking of the deposited film is generated during a semiconductor manufacturing process. When the thickness of the deposited film reaches about 1 $\mu$m, the number of particles adhering to a wafer becomes 100/wafer or greater, and the number of the particles is never reduced thereafter.

For this reason, it is necessary to eliminate the deposited film in order to maintain the number of particle adhering to a wafer at a level equal to or lower than a predetermined value, and the inner tube 6 and the outer tube 5 constituting the reaction furnace 2 was cleaned before the thickness of the deposited film reaches about 1 $\mu$m.

When constituent members of the reaction furnace 2 such as the outer tube 5 and the inner tube 6 are cleaned, operation of the semiconductor manufacturing apparatus is stopped and the reaction furnace 2 is disassembled. Therefore, if the cleaning frequency is high, there are problems that the rate of operation of the semiconductor manufacturing apparatus is lowered, and productivity is deteriorated.

SUMMARY OF THE INVENTION

The present inventor has found that it is possible to reduce adhesion of the fine particles to a wafer by forcibly generating a cracking in a deposited film of reaction by-products during the manufacturing process of a semiconductor apparatus, and by forcibly discharging out, by means of a gas purge, the fine particles generated when the cracking was generated, and as a result, it is possible to reduce the frequency of cleaning operations of a reaction furnace, and to enhance the productivity.

The present inventor has found that it is possible to reduce adhesion of the fine particles to a wafer by lowering the temperature in a reaction furnace, in a state where there are no substrates to be processed in the reaction furnace, to increase the stress of a reaction by-product deposited film adhered to the reaction furnace, and by forcibly generating a cracking in the deposited film, and by forcibly discharging out, by means of a gas purge, the fine particles generated when the cracking was generated.

The present invention is based upon the above-mentioned findings, and according to a first aspect of the present invention, there is provided a method for manufacturing a semiconductor device, comprising:

forming a film on a substrate to be processed in a reaction furnace at a first temperature, unloading the substrate from the reaction furnace, and lowering a temperature in the reaction furnace to a second temperature which is lower than the first temperature, and conducting a gas purge, using only an inert gas, in the reaction furnace after the substrate has been unloaded from the reaction furnace.

According to a second aspect of the present invention, there is provided a method for manufacturing a semiconductor device, comprising:

conducting batch processing in a reaction furnace in a state in which a plurality of substrates to be processed are mounted on a boat, to form films on the plurality of substrates to be processed at a first temperature, thereafter unloading the boat from the reaction furnace, taking out processed substrates, after the boat has been unloaded from the reaction furnace, lowering a temperature in the reaction furnace to a second temperature which is lower than the first temperature, conducting a gas purge in the reaction furnace using only an inert gas, and thereafter raising the temperature in the reaction furnace to a temperature higher than the second temperature, mounting, on the boat, a plurality of substrates to be processed next, and loading, into the reaction furnace, the boat on which the plurality of substrates to be processed next are mounted, after raising a temperature in the reaction furnace to the temperature higher than the second temperature.

According to a third aspect of the present invention, there is provided a semiconductor manufacturing apparatus, comprising:

a reaction furnace for subjecting a substrate or substrates to be processed to film forming processing, a reaction gas introducing member for introducing a reaction gas into the reaction furnace, an evacuating device for evacuating the reaction furnace, an inert gas introducing member for introducing an inert gas into the reaction furnace, and a temperature controller for controlling a temperature in the reaction furnace, wherein the temperature controller controls a temperature in the reaction furnace to a first temperature and the reaction gas introducing member introduces the reaction gas into the reaction furnace subjecting the substrate or the substrates to be processed to the film forming processing and after a processed substrate or substrates have been unloaded from the reaction furnace, the temperature controller drops a temperature in the reaction furnace to a second temperature which is lower than the first temperature and a gas purge is conducted in the reaction furnace using only the inert gas by introducing the inert gas into the reaction furnace by the inert gas introducing member and evacuating the reaction furnace by the evacuating device.

According to a fourth aspect of the present invention, there is provided a method for forming a film, comprising:

forming a film on a substrate to be processed in a reaction furnace at a first temperature, unloading the substrate from the reaction furnace, and lowering a temperature in the reaction furnace to a second temperature which is lower than the first temperature, and conducting a gas purge, using only an inert gas, in the reaction furnace in a state in which the substrate is unloaded from the reaction furnace.

According to a fifth aspect of the present invention, there is provided a film forming apparatus, comprising:

a reaction furnace for subjecting a substrate or substrates to be processed to film forming processing, a reaction gas introducing member for introducing a reaction gas into the reaction furnace, an evacuating device for evacuating the reaction furnace, an inert gas introducing member for introducing an inert gas into the reaction furnace, and a temperature controller for controlling a temperature in the reaction furnace, wherein the temperature controller controls the temperature in the reaction furnace to a first temperature and the reaction gas introducing member introduces the reaction gas into the reaction furnace subjecting the substrate or the substrates to be processed to the film forming processing and after a processed substrate or substrates have been unloaded from the reaction furnace, the temperature controller drops the temperature in the reaction furnace to a second temperature which is lower than the first temperature and a gas purge is conducted in the reaction furnace using only the inert gas by introducing the inert gas into the reaction furnace by the inert gas introducing member and evacuating the reaction furnace by the evacuating device.

According to a sixth aspect of the present invention, there is provided a method for manufacturing a semiconductor device, comprising:

heating an inside of a reaction chamber with a heater disposed outside of the reaction chamber to a first temperature, forming a film on a substrate to be processed in the reaction chamber at the first temperature, unloading the substrate from the reaction chamber, and lowering a temperature in the reaction chamber using only an inert gas to a second temperature which is lower than the first temperature, and conducting a gas purge in the reaction chamber after the substrate has been unloaded from the reaction chamber.

According to a seventh aspect of the present invention, there is provided a method for manufacturing a semiconductor device, comprising:

heating an inside of a reaction chamber with a heater disposed outside of the reaction chamber to a first temperature, conducting batch processing in the reaction chamber when a plurality of substrates to be processed are mounted on a boat, to form films on the plurality of substrates to be processed at the first temperature, thereafter, unloading the boat from the reaction chamber, taking out processed substrates, after the boat has been unloaded from the reaction chamber, lowering a temperature in the reaction chamber to a second temperature which is lower than the first temperature, conducting a gas purge in the reaction chamber using only an inert gas, and thereafter raising the temperature in the reaction chamber to a temperature higher than the second temperature, mounting, on the boat, a plurality of substrates to be processed next, and loading, into the reaction chamber, the boat on which the plurality of substrates to be processed next are mounted, after raising the temperature in the reaction chamber to the temperature higher than the second temperature.

According to an eighth aspect of the present invention, there is provided a semiconductor manufacturing apparatus comprising:

a reaction chamber for subjecting a substrate or substrates to be processed to film forming processing, a heater disposed outside of the reaction chamber for heating an inside of the reaction chamber, a reaction gas introducing member for introducing a reaction gas into the reaction chamber, an evacuating device for evacuating the reaction chamber, an inert gas introducing member for introducing an inert gas into the reaction chamber, and a temperature controller for controlling a temperature in the reaction chamber, wherein the temperature controller controls the temperature in the reaction chamber to a first temperature and the reaction gas introducing member introduces the reaction gas into the reaction chamber subjecting the substrate or the substrates to be processed to the film forming processing and after a processed substrate or substrates have been unloaded from the reaction chamber, the temperature controller drops the temperature in the reaction chamber to a second temperature which is lower than the first temperature and a gas purge, using only the inert gas, is conducted in the reaction chamber by introducing the inert gas into the reaction chamber by the inert gas introducing member and evacuating the reaction chamber by the evacuating device.

According to a ninth aspect of the present invention, there is provided a method for manufacturing a semiconductor device, comprising:

forming a film on a substrate to be processed in a reaction furnace at a first temperature;

unloading the substrate from the reaction furnace;

after the substrate is unloaded from the reaction furnace, lowering a temperature in the reaction furnace to a second temperature which is lower than the first temperature and conducting a gas purge in the reaction furnace; and after lowering the temperature in the reaction furnace and conducting the gas purge, loading a substrate to be processed next into the reaction furnace, wherein a range of temperature drop in the temperature lowering from the first temperature to the second temperature is greater than a range of temperature drop generated in the reaction furnace when the substrate to be processed next is loaded into the reaction furnace.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Embodiments of the present invention will be explained with reference to the drawings below.

First, referring to FIG. 3, a semiconductor manufacturing apparatus for carrying out CVD film forming processing will be explained.

Figure 3:
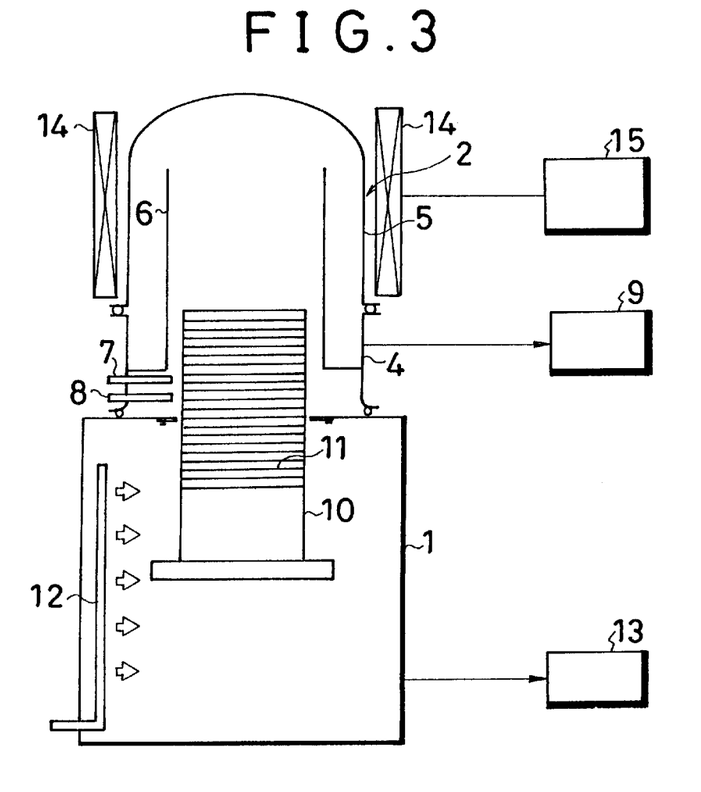
FIG. 3 is a schematic longitudinal sectional view for explaining the one embodiment of the present invention.
Figure 4:
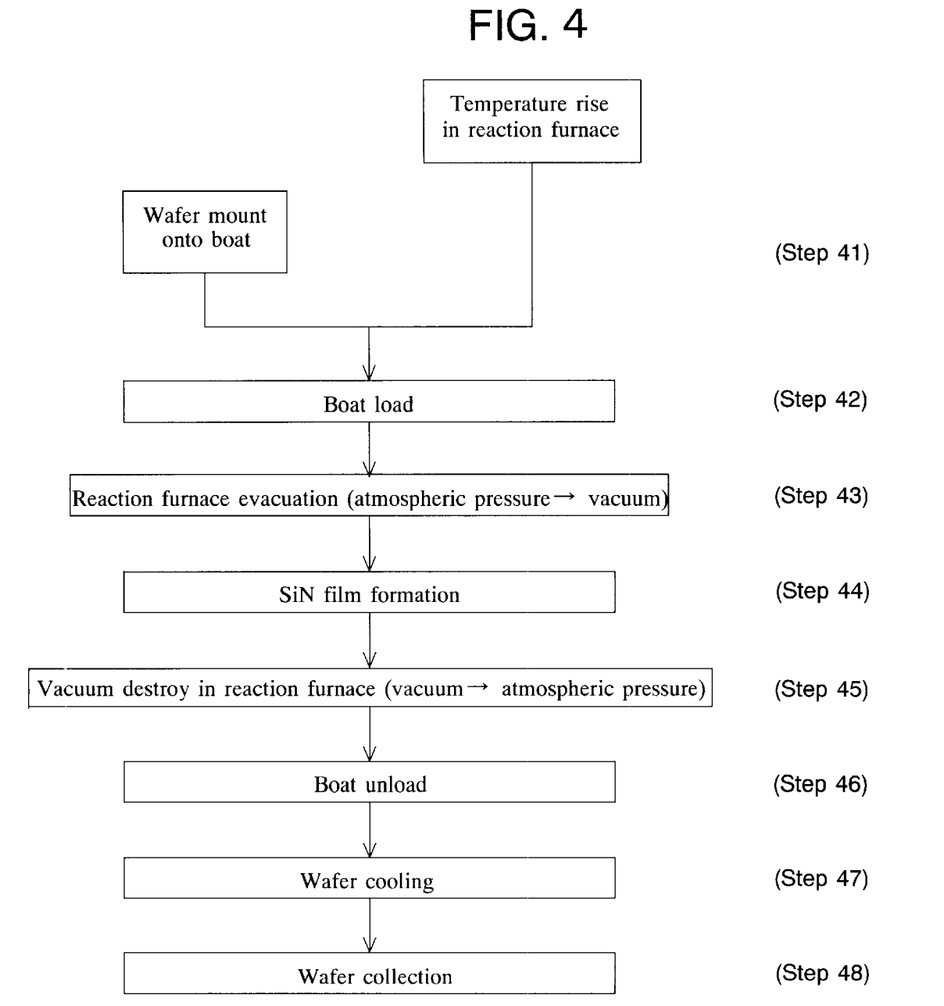
FIG. 4 is a block diagram showing steps of a conventional manufacturing method for a semiconductor device.

The semiconductor manufacturing apparatus shown in FIG. 3 is of a batch processing type, and more particularly, of a load lock type having a load lock chamber as a preliminary chamber.

An air-tight load lock chamber 1 is air-tightly provided at its upper wall with a reaction furnace 2. The load lock chamber 1 is also air-tightly provided with a substrate transfer chamber (not shown) with a gate valve (not shown).

The reaction furnace 2 includes a furnace opening flange 4 air-tightly mounted to the upper wall of the load lock chamber 1, an outer tube 5 air-tightly standing from the furnace opening flange 4, an inner tube 6 concentrically standing in the outer tube 5, a heater 14 provided such as to surround the outer tube 5, and a temperature controller 15 for controlling a temperature in the furnace by controlling the heater 14, and so forth. Gas introducing lines 7 and 8 for introducing an inert gas such as nitrogen and a reaction gas are in communication with the reaction furnace 2, and an evacuating device 9 is also in communication with the reaction furnace 2.

The load lock chamber 1 is provided with a boat elevator (not shown) for hoisting and lowering a boat 10 so as to load and unload the boat 10 into and from the reaction furnace 2. Wafers 11 which are substrates to be processed are mounted in multiple layers on the boat 10 in a horizontal attitude. A gas purge nozzle 12 is uprightly provided in the load lock chamber 1 in parallel to the boat 10 in its lowering state. An evacuating device 13 is in communication with the load lock chamber 1, the load lock chamber 1 is evacuated by the evacuating device 13. Nitrogen gas which is one of inert gases is supplied to the load lock chamber 1 by the gas purge nozzle 12, and a pressure in the load lock chamber 1 is brought back into the atmospheric pressure.

Semiconductor wafer processing will be explained below.

Figure 1:
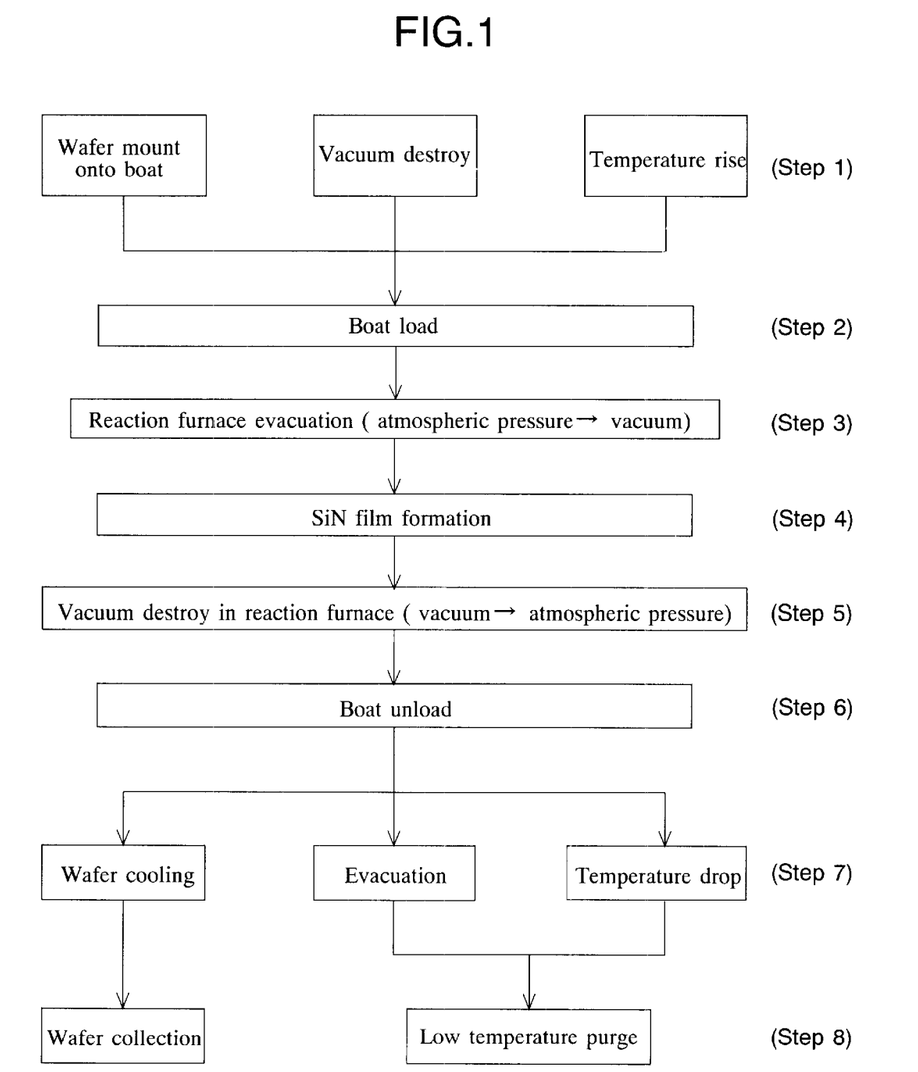
FIG. 1 is a block diagram for explaining steps of a manufacturing method for a semiconductor device according to one embodiment of the present invention.

Pressures in the load lock chamber 1 as the preliminary chamber and the substrate transfer chamber (not shown) are kept at the atmospheric pressure for example, and a predetermined number of wafers 11 are mounted on the boat 10 by the substrate transfer device (not shown) in a state where the boat 10 is lowered. In this state, the reaction furnace 2 is air-tightly closed, and when the wafers 11 are mounted on the boat 10, the inert gas, e.g., $N_2$ is introduced into the reaction furnace 2 to destroy the vacuum therein, i.e., a pressure in the reaction furnace 2 is brought back to the atmospheric pressure, and the interior of the reaction furnace 2 is heated to a film forming temperature at the same time (step 1).

When the temperature in the reaction furnace 2 reaches the film forming temperature, the boat 10 is hoisted by the boat elevator (not shown), and the boat 10 is loaded into the reaction furnace 2 (step 2). After the boat 10 is loaded, the interior of the reaction furnace 2 is evacuated into vacuum by the evacuating device 9 (step 3), and the reaction gas is introduced into the reaction furnace 2 by the gas introducing lines 7 and 8, and films are formed on the wafers 11 (step 4).

After the film forming processing is completed, the interior of the reaction furnace 2 is returned into the atmospheric pressure by introducing the inert gas (e.g., $N_2$) from the gas introducing lines 7 and 8 so that the pressure in the reaction furnace 2 is brought into substantially the same pressure as that in the load lock chamber 1 (step 5). Then, the wafers 11 are lowered by the boat elevator (not shown) and unloaded into the load lock chamber 1 (step 6).

The wafers 11 are cooled in the load lock chamber 1. Simultaneously with the cooling operation of the wafers 11, the reaction furnace 2 is air-tightly closed and evacuated, and a temperature in the load lock chamber 1 is lowered to a predetermined temperature (step 7). Although the temperature in the furnace is lowered when the boat 10 is loaded into the reaction furnace 2, this predetermined temperature drop is set greater than a temperature drop when the boat 10 is loaded.

When the cooling operation of the wafers 11 in the load lock chamber 1 is completed, the wafers 11 are brought out from the boat 10 by the substrate transfer device (not shown). The interior of the reaction furnace 2 is gas-purged while introducing a small amount of inert gas (e.g., $N_2$) into the reaction furnace 2 in a state where the temperature in the reaction furnace 2 is low (the temperature is lowered to the above-described value) (step 8).

After the wafers 11 are brought out, unprocessed wafers which will be subjected to the next processing are mounted on the boat 10. Simultaneously with this wafer mounting operation, the inert gas (e.g., $N_2$) is introduced into the reaction furnace 2, and the pressure in the reaction furnace 2 is brought back to the atmospheric pressure and the temperature in the reaction furnace 2 is heated to the film forming temperature to carry out boat loading preparation. Then, the next processing is carried out.

Thereafter, semiconductor devices are manufactured using the semiconductor wafers on which the films are formed in the above-described manner.

In the above-described wafer processing, the interior of the reaction furnace 2 is evacuated into vacuum in a state where the reaction furnace 2 is air-tightly closed after the boat is unloaded, and the temperature in the furnace is dropped to a predetermined temperature lower than the film forming temperature. By dropping the temperature in this manner, thermal stress is positively allowed to be generated in the reaction by-product deposited film on the inner surface of the reaction furnace 2. Especially, the temperature drop to the predetermined temperature in this situation is set greater than the temperature drop when the boat is loaded. Therefore, the stress generated on the deposited film naturally becomes greater than that when the boat is loaded. The cracking is thus positively forced to be generated in the deposited film in a state where the boat is unloaded, and the gas purge in the reaction furnace 2 is further carried out to discharge fine particles spattered by the cracking out of the reaction furnace 2.

The temperature in the reaction furnace 2 is lowered by influence of the boat 10 at a low temperature and having large thermal capacity when the boat is loaded, but this temperature drop is smaller than the above-mentioned temperature drop after the boat is unloaded. As a result, the stress generated on the deposited film is also small. It is, therefore, possible to prevent a new cracking from being generated on the deposited film when the boat is loaded. Further, when the temperature is raised, the stress on the deposited film is reduced, and therefore the stress on the deposited film is reduced at the time of the film formation processing, resulting in further reducing the probability that a new cracking is generated at the time of the film formation processing.

Thus, a cracking on the deposited film is forced to be generated beforehand, fine particles caused by generation of cracking are forcibly discharged out of the reaction furnaces 2 before the boat is loaded, and therefore, films can be formed on the wafers in a state there is no or a very small amount of fine particles.

Since it is possible to eliminate particles which are generated by the cracking in the deposited film, it is sufficient to clean the reaction furnace 2 before the deposited film is peeled off. Therefore, it is possible to extensively elongate the cleaning interval of the reaction furnace 2.

Further, the steps added to for the conventional batch processing, i.e., the step for increasing a temperature in the reaction furnace 2 to the film forming temperature before the boat is loaded, and the step for dropping the temperature in the reaction furnace 2 after the boat is unloaded are respectively carried out simultaneously with the mounting and removing operation of the wafer on and from the boat 10, and with the wafer cooling operation in the load lock chamber 1. Therefore, the time required for the batch processing is not elongated as compared with the conventional method.

In the above-described embodiment, as an embodiment, after the boat is unloaded from the reaction furnace 2, the reaction furnace 2 is evacuated into vacuum and the temperature therein is dropped simultaneously when the wafers 11 are cooled in the load lock chamber 1, and after the cooling operation of the wafers 11 is completed, the reaction furnace 2 is gas-purged when the wafers 11 are discharged from the boat 10, and after the discharging operation of the wafers 11 from the boat 10 is completed, the interior of the reaction furnace 2 is brought back to the atmospheric pressure and the temperature therein is increased to the film forming temperature when wafers 11 to be processed next are mounted on the boat 10. Generally, the temperature drop of the reaction furnace 2, the gas purge, and the temperature increase to the film forming temperature may of course be carried out after the boat is unloaded from the reaction furnace 2 and before the boat on which other wafers 11 to be processed next is mounted is loaded.

When an influence of the temperature drop at the time of the loading operation of the boat is small, i.e., when a range of the temperature drop is small or the number of particles generated is small even if the temperature is dropped, the temperature increase to the film forming temperature may be carried out after the boat is loaded.

The temperature may not be increased to the film forming temperature, and the temperature may be increased to a temperature such that the temperature in the furnace when the temperature is dropped when the boat is loaded is equal to or higher than a temperature in the furnace when the temperature is dropped after the boat 10 is unloaded.

In the above-described embodiment, the pressure in the reaction furnace 2 and the pressure in the load lock chamber 1 are substantially equal to the atmospheric pressure both when the boat is loaded and unloaded, but if the pressures are substantially equal to each other, such pressure may be a lower pressure than the atmosphere pressure or a vacuum pressure. In such a case, after the wafers 11 are mounted on the boat 10 under the atmospheric pressure, the load lock chamber 1 is once evacuated into vacuum and then, the inert gas is supplied to keep the pressure at the predetermined value when the boat is loaded.

Although the load lock chamber is used as the preliminary chamber in the above-described embodiment, the preliminary chamber may not have a load lock function, and in such a case, the gas purging procedure in the reaction furnace 2 is also the same.

In the above-described embodiment, the reaction furnace 2 is evacuated into vacuum after the boat is unloaded, the temperature is dropped, and the reaction furnace 2 is discharged while introducing the inert gas into the reaction furnace 2 to carry out the gas purge when the wafers 11 are removed from the boat 10, but the evacuation and the gas purge may be carried out as one action. That is, the air discharging operation may be continued while introducing a small amount of inert gas into the reaction furnace 2 after the boat is unloaded and before the boat is loaded next. At that time, the evacuation and the gas purge may be continuously carried out as one action by setting the amount of the introducing rate of the inert gas to be smaller than the evacuation rate.

The temperature may be dropped at the same time with the gas purge or before the gas purge.

When the gas purge is carried out, the reaction furnace 2 is evacuated while introducing the inert gas into the reaction furnace 2. Alternatively, after the wafers are removed, and after a temperature in the reaction furnace is lowered, the gas purge may be carried out by repeating that the inert gas is introduced into the reaction furnace 2, and the reaction furnace 2 is evacuated with the introducing operation of the inert gas stopped.

Although the batch type semiconductor manufacturing apparatus has been explained in the above embodiment, it is of course possible to carry out the invention also in a single wafer processing type semiconductor manufacturing apparatus using no boat by replacing the "boat" with the "wafer", and it is also of course possible to carry out the invention in a batch type semiconductor manufacturing apparatus having no load lock chamber.

EXAMPLES

Next, a process for forming, on a silicon wafer, an SiN film, especially an $Si_3N_4$ film whose film thickness formed at one time is 1000 Å or greater will be explained.

DCS (dichlorosilane) and $NH_3$ are used as the reaction gases, the film forming temperature in the furnace is 750° C. to 800° C., and the temperature drop in the temperature dropping processing is set in a range of 100° C. to 150° C. This temperature drop is set because the conventional temperature drop with respect to the film forming temperature when the boat is loaded is 70° C. Large temperature drop is preferable for generating cracking, but if the temperature is dropped excessively, the time required for increasing the temperature to the film forming temperature is elongated, and throughput is lowered. By setting the temperature drop in the range of 100° C. to 150° C., sufficient effect can be obtained without elongating the processing time as compared with the conventional method.

The number of particles adhered to a wafer will be explained with reference to FIG. 2.

Figure 2:
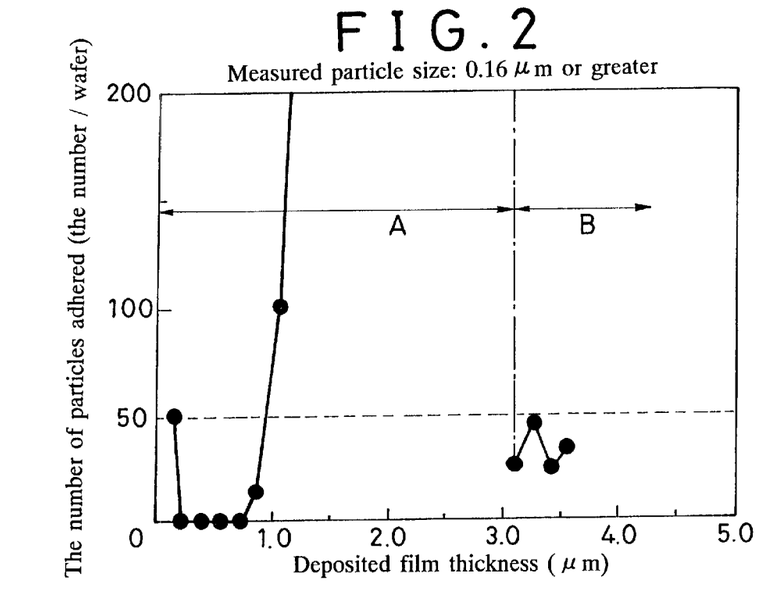
FIG. 2 is a graph showing a relationship between thickness of deposited films and the number of particles adhered to wafers.

FIG. 2 shows the number of particles of 0.16 μm or greater adhered to a wafer after the film forming processing.

In FIG. 2, a region shown with "A" is a portion to which the present invention is not applied, and a region shown with "B" was a portion to which the invention was applied.

When the present invention is not applied, the number of particles is abruptly increased when the thickness of the deposited film exceeds 1 μm. Whereas when the present invention is applied, the number of particles is 50 or less even if the thickness of the deposited film exceeds 3 μm. According to the experiment, it was confirmed that the number of particles was 50 or less until the thickness of the deposited film exceeds 3.6 μm. In the case of this example, the film thickness deposited at one time batch processing is 0.15 μm. Therefore, although the number of continuous batch processing is about 7, when the present embodiment is applied, it is possible to carry out the continuous batch processing about 24 times.

As described above, advantages of the present invention may includes one or more of the following: A cracking is forcibly allowed to be generated in a reaction by-product deposited film before the film forming processing, thereby discharging out fine particles generated when the cracking is generated. Therefore, it is possible to restrain the fine particles from being generated at the time of the film forming processing, and a film of high quality can be formed. Further, since the reaction furnace may be cleaned before the deposited film is peeled off, the interval between the cleaning periods is elongated, the maintenance operation is facilitated, and the rate of operation is enhanced. Further, the processing time is not elongated as compared with the conventional method.

Although various exemplary embodiments have been shown and described, the invention is not limited to the embodiments shown. Therefore, the scope of the invention is intended to be limited solely by the scope of the claims that follow.

What is claimed is:

1. A method for manufacturing a semiconductor device, comprising;

forming a film on a substrate to be processed in a reaction furnace at a first temperature, unloading said substrate from said reaction furnace, and lowering a temperature in said reaction furnace to a second temperature which is lower than said first temperature, and conducting a gas purge, using only an inert gas, in said reaction furnace after said substrate has been unloaded from said reaction furnace.

2. The method for manufacturing a semiconductor device as recited in claim 1, further comprising a step of loading a substrate to be processed next into said reaction furnace, after said step of lowering the temperature in said reaction furnace and conducting said gas purge.

3. The method for manufacturing a semiconductor device as recited in claim 2, wherein a range of temperature drop in said step of lowering said temperature is greater than a range of temperature drop generated in said reaction furnace when said substrate to be processed next is loaded into said reaction furnace.

4. The method for manufacturing a semiconductor device as recited in claim 2, further comprising the step of raising a temperature in said reaction furnace after said step of lowering said temperature in said reaction furnace and conducting said gas purge and before said step of loading said substrate to be processed next into said reaction furnace.

5. The method for manufacturing a semiconductor device as recited in claim 4, wherein said temperature in said reaction furnace when said substrate to be processed next is loaded into said reaction furnace becomes higher than said second temperature at the time of said step of lowering said temperature, by said step of raising said temperature in said reaction furnace.

6. The method for manufacturing a semiconductor device as recited in claim 4, wherein said step of lowering said temperature in said reaction furnace is effected at the same time with said gas purge or before said gas purge, and said gas purge is effected without introducing any gases reactive to said film into said reaction furnace between said step of lowering said temperature in said reaction furnace and said gas purge when said step of lowering said temperature in said reaction furnace is effected before said gas purge.

7. The method for manufacturing a semiconductor device as recited in claim 1, wherein said gas purge is conducted by evacuating said reaction furnace while introducing said inert gas into said reaction furnace.

8. A method for manufacturing a semiconductor device, comprising:

conducting batch processing in a reaction furnace in a state in which a plurality of substrates to be processed are mounted on a boat, to form films on said plurality of substrates to be processed at a first temperature, thereafter unloading said boat from said reaction furnace, taking out processed substrates, after said boat has been unloaded from said reaction furnace, lowering a temperature in said reaction furnace to a second temperature which is lower than said first temperature, conducting a gas purge in said reaction furnace using only an inert gas, and thereafter raising said temperature in said reaction furnace to a temperature higher than said second temperature, mounting, on said boat, a plurality of substrates to be processed next, and loading, into said reaction furnace, said boat on which said plurality of substrates to be processed next are mounted, after raising said temperature in said reaction furnace to said temperature higher than said second temperature.

9. The method for manufacturing a semiconductor device as recited in claim 8, wherein said temperature in said reaction furnace is lowered, and said gas purge is conducted in said reaction furnace by introducing said inert gas into said reaction furnace and evacuating said reaction furnace, after said boat is unloaded from said reaction furnace to a preliminary chamber, while said processed substrates on said boat are cooled in said preliminary chamber, and while said processed substrates are taken out from said boat, and thereafter, said temperature in said reaction furnace is increased and a pressure in said reaction furnace is brought into substantially the same pressure as in said preliminary chamber while said plurality of substrates to be processed next are mounted on said boat in said preliminary chamber.

10. The method for manufacturing a semiconductor device as recited in claim 8, wherein said step of forming films on said plurality of substrates to be processed at said first temperature is a step of forming films made of silicon nitride and each having a film thickness of 1000 Å or more.

11. The method for manufacturing a semiconductor device as recited in claim 6, wherein said step of lowering said temperature in said reaction furnace is effected at the same time with said gas purge or before said gas purge, and said gas purge is effected without introducing any gases reactive to said film into said reaction furnace between said step of lowering said temperature in said reaction furnace and said gas purge when said step of lowering said temperature in said reaction furnace is effected before said gas purge.

12. A method for forming a film, comprising:

forming a film on a substrate to be processed in a reaction furnace at a first temperature, unloading said substrate from said reaction furnace, and lowering a temperature in said reaction furnace to a second temperature which is lower than said first temperature, and conducting a gas purge, using only an inert gas, in said reaction furnace in a state in which said substrate is unloaded from said reaction furnace.

13. The method for forming a film as recited in claim 12, further comprising:

loading a substrate to be processed next into said reaction furnace, after said step of lowering said temperature in said reaction furnace and conducting said gas purge, and raising said temperature in said reaction furnace after said step of lowering said temperature in said reaction furnace and conducting said gas purge and before said step of loading said substrate to be processed next into said reaction furnace, wherein a range of temperature drop in said step of lowering said temperature in said reaction furnace is greater than a range of temperature drop generated in said reaction furnace when said substrate to be processed next is loaded into said reaction furnace, and said step of lowering said temperature in said reaction furnace is effected at the same time with said gas purge or before said gas purge, and said gas purge is effected without introducing any gases reactive to said film into said reaction furnace between said step of lowering said temperature in said reaction furnace and said gas purge when said step of lowering said temperature in said reaction furnace is effected before said gas purge.

14. A method for manufacturing a semiconductor device, comprising:

heating an inside of a reaction chamber with a heater disposed outside of said reaction chamber to a first temperature, forming a film on a substrate to be processed in said reaction chamber at said first temperature, unloading said substrate from said reaction chamber, and lowering a temperature in said reaction chamber to a second temperature which is lower than said first temperature, and conducting a gas purge in said reaction chamber using only an inert gas after said substrate has been unloaded from said reaction chamber.

15. A method for manufacturing a semiconductor device, comprising:

heating an inside of a reaction chamber with a heater disposed outside of said reaction chamber to a first temperature, conducting batch processing in said reaction chamber when a plurality of substrates to be processed are mounted on a boat, to form films on said plurality of substrates to be processed at said first temperature, thereafter, unloading said boat from said reaction chamber, taking out processed substrates, after said boat has been unloaded from said reaction chamber, lowering a temperature in said reaction chamber to a second temperature which is lower than said first temperature, conducting a gas purge in said reaction chamber using only an inert gas, and thereafter raising said temperature in said reaction chamber to a temperature higher than said second temperature, mounting, on said boat, a plurality of substrates to be processed next, and loading, into said reaction chamber, said boat on which said plurality of substrates to be processed next are mounted, after raising said temperature in said reaction chamber to said temperature higher than said second temperature.

16. A method for manufacturing a semiconductor device, comprising:

forming a film on a substrate to be processed in a reaction furnace at a first temperature;

unloading said substrate from said reaction furnace;

after said substrate is unloaded from said reaction furnace, lowering a temperature in said reaction furnace to a second temperature which is lower than said first temperature and conducting a gas purge in said reaction furnace; and after lowering the temperature in said reaction furnace and conducting said gas purge, loading a substrate to be processed next into said reaction furnace, wherein a range of temperature drop in said temperature lowering from said first temperature to said second temperature is greater than a range of temperature drop generated in said reaction furnace when said substrate to be processed next is loaded into said reaction furnace.

* * * * *